(12) United States Patent
Yano et al.

(10) Patent No.: US 6,454,819 B1
(45) Date of Patent: Sep. 24, 2002

(54) COMPOSITE PARTICLES AND PRODUCTION PROCESS THEREOF, AQUEOUS DISPERSION, AQUEOUS DISPERSION COMPOSITION FOR CHEMICAL MECHANICAL POLISHING, AND PROCESS FOR MANUFACTURE OF SEMICONDUCTOR DEVICE

(75) Inventors: Hiroyuki Yano; Gaku Minamihaba; Yukiteru Matsui; Katsuya Okumura, all of Yokohama; Masayuki Motonari, Tokyo; Masayuki Hattori, Tokyo; Akira Iio, Tokyo, all of (JP)

(73) Assignees: Kabushiki Kaisha Toshiba, Kawasaki (JP); JSR Corporation, Tokyo (JP)

( * ) Notice: Subject to any disclaimer, the term of this patent is extended or adjusted under 35 U.S.C. 154(b) by 0 days.

(21) Appl. No.: 09/484,064

(22) Filed: Jan. 18, 2000

(30) Foreign Application Priority Data

Jan. 18, 1999 (JP) ............................................. 11-009902
Jan. 18, 1999 (JP) ............................................. 11-009906

(51) Int. Cl.$^7$ ............................. C09K 3/14; C09G 1/02; C09G 1/04; B24B 1/00
(52) U.S. Cl. ............................. 51/298; 51/307; 51/308; 51/309; 106/3; 438/692; 438/693; 252/79.1; 524/443; 216/89
(58) Field of Search ......................... 51/298, 307, 309, 51/308; 106/3; 438/693, 692; 252/79.1, 79.2; 524/443; 523/204; 428/403, 404; 216/89

(56) References Cited

U.S. PATENT DOCUMENTS 5,783,489 A * 7/1998 Kaufman et al. .............. 51/308
6,136,891 A * 10/2000 Chopin et al. .............. 427/220

FOREIGN PATENT DOCUMENTS

| DE | 44 36 047 | | 4/1995 |
| EP | 0 661 311 | | 7/1995 |
| JP | 06142491 A | * | 5/1994 |
| JP | 7-86216 | | 3/1995 |
| JP | 9-246852 | | 9/1997 |
| JP | 9-285957 | | 11/1997 |
| JP | 10-168431 | | 6/1998 |
| JP | 10-231473 | | 9/1998 |
| JP | 10-270400 | | 10/1998 |

* cited by examiner

Primary Examiner—Michael Marcheschi
(74) Attorney, Agent, or Firm—Oblon, Spivak, McClelland, Maier & Neustadt, P.C.

(57) ABSTRACT

A process for chemical mechanical polishing of a working film on a wafer, which entails conducting the chemical mechanical polishing with an aqueous dispersion containing water and composite particles, the composite particles containing polymer particles having at least one of a silicon compound portion or section and a metal compound portion or section formed directly or indirectly on the polymer particles.

37 Claims, No Drawings

COMPOSITE PARTICLES AND PRODUCTION PROCESS THEREOF, AQUEOUS DISPERSION, AQUEOUS DISPERSION COMPOSITION FOR CHEMICAL MECHANICAL POLISHING, AND PROCESS FOR MANUFACTURE OF SEMICONDUCTOR DEVICE

BACKGROUND OF THE INVENTION

1. Field of the Invention

The present invention relates to composite particles and a production process thereof, as well as to an aqueous dispersion containing the composite particles and water, to an aqueous dispersion composition for chemical mechanical polishing (hereunder referred to as "CMP slurry"), and to a process for manufacture of semiconductor device.

The composite particles of the invention have improved strength and hardness, excellent heat resistance, and can be utilized as cosmetics, electronic materials, magnetic materials, coating materials, paints, spacers, optical materials, catalysts, photocatalysts, fillers, electronic material film lubricants, diagnostic agents, drugs, conductive materials, sensor materials, toners, resin modifiers, inks, adsorbing agents, ultraviolet-resistant materials, and masking materials, for example, and may be in the form of an aqueous dispersion to be used as a polishing material for magnetic disks or wafers. The CMP slurry of the present invention can also be suitably used for manufacture of various semiconductor device.

2. Description of the Background

Polymer particles have conventionally been used for standard particles, diagnostic agent carrier particles, and lubricants, for example with a narrow particle size distribution obtained by copolymerizing vinyl monomers or the like. However, such polymer particles do not always exhibit sufficient strength and heat resistance, and when used as standard particles or lubricants, application of excess shear stress or exposure to high temperature can cause deformation or destruction of the particles, and therefore their uses are limited. In order to address these problems there have been proposed particles made of copolymers of crosslinkable vinyl monomers, for example, that are copolymerized with a high degree of crosslinking. However, particles made of such crosslinked polymers have lower hardness and insufficient heat resistance compared to inorganic-based particles, and therefore are not suitable for a very wide range of uses.

For uses such as electronic materials, magnetic materials, and heat-resistant materials, for example, there have been employed particles made of numerous metal compounds, and a variety of composite particles have been proposed for diverse purposes. As such types of composite particles there may be mentioned composite particles comprising iron oxide particles coated with silicon compounds, so that in production of filamentous magnetic bodies by heat treatment it is possible to prevent shape collapsing and sintering between magnetic bodies; composite particles comprising iron powder coated with copper as a high strength material for powder metallurgy; and composite particles comprising iron oxide particles coated with antimony oxide and aluminum oxide for improved heat resistance. However, since such composite particles are all composed of metal compounds, they are too hard and are not always adequately suited for diverse purposes. The development of composite particles with appropriate hardness has thus become a necessity particularly in the fields of electronic materials, magnetic materials, optical materials, polishing materials, and so forth.

Aqueous dispersions of oxide particles such as colloidal silica or colloidal alumina have been commonly used as polishing materials for chemical mechanical polishing of semiconductor element surfaces and semiconductor element interlayer insulating films in semiconductor devicees, and particularly as polishing materials for wafer surfaces. However, aqueous dispersions of such oxide particles tend to form aggregates due to their low dispersion stability, and the aggregates create surface defects (hereunder referred to as "scratches") in polishing surfaces, that result in reduced yields of the semiconductor products. As a method of addressing this problem there have been proposed a method of adding surfactants to oxide particle dispersions, a method of using homogenizers or the like for more even dispersion, and a method of removing the aggregates with filters. However, these measures not only fail to improve the polishing materials themselves, but can also create new problems, such as lower polishing rates and contamination of polishing surfaces by metal ions.

Japanese Laid-open Patent Publication No. Hei-7-86216 discloses a process for production of a semiconductor device by chemical mechanical polishing using particles made of an organic polymer compound. In this process, the residual polishing particles can be fired and removed after polishing, to thus avoid imperfections in semiconductor devicees by those residual particles. Nevertheless, since the particles made of this organic polymer compound have lower hardness than silica or alumina particles, it has not been possible to achieve high polishing rates therewith.

SUMMARY OF THE INVENTION

Accordingly, it is an object of the present invention to provide composite particles that exhibit adequate strength and hardness, excellent heat resistance, and suitable flexibility by providing metal compound sections in the interior and on the surface of the polymer particles, thus allowing their use for the wide range of purposes mentioned above, as well as a production process thereof.

It is another object of the present invention to provide an aqueous dispersion containing these composite particles and water, which is useful for a variety of purposes such as electronic materials, magnetic materials, optical materials, and the like, and particularly an aqueous dispersion to be used for polishing of magnetic disks.

It is still another object of the present invention to provide a CMP slurry wherein a silicon compound section or metal compound section is provided in the polymer particles to give the surface thereof adequate strength and hardness, excellent heat resistance and suitable flexibility and to increase the polishing rate while also preventing scratches, and by providing a process for manufacture of semiconductor devices using the CMP slurry. The CMP slurry is useful for chemical mechanical polishing in the manufacture of semiconductor devicees, and especially chemical mechanical polishing of wafer surfaces.

DETAILED DESCRIPTION OF THE PREFERRED EMBODIMENT

The composite particles of the present invention are characterized by having polymer particles and at least one of a metal compound portion or section which is at least one of a metalloxane bond-containing section and a metal oxide particle section, provided that titanium is not the metal of the metalloxane bond-containing section, and a silica particle portion or section formed directly or indirectly on the polymer particles.

The production process for the composite particles of the present invention is characterized by chemically bonding part of a coupling compound to polymer particles and then at least one of (1) chemically bonding or chemically bonding and polycondensing a compound of ① described below and (2) chemically bonding a compound of ② described below to another part of the coupling compound to form at least one of a metal compound section and a silica particle section indirectly on the polymer particles.

① A compound having the formula $R_nM(OR')_{z-n}$ (Compound ① and ② are: where R is a monovalent organic group of 1–8 carbon atoms, R' is an alkyl group of 1–5 carbon atoms, an acyl group of 2–6 carbon atoms or an aryl group of 6–9 carbon atoms; M is Al, V, Cr, Mn, Fe, Co, Ni, Cu, Zn, Ge, Zr, Nb, Mo, Sn, Sb, Ta, W, Pb or Ce; and z is the valency of M. Also, n is an integer of 0 to (z−1), and when n is 2 or greater, each R may be the same or different. When (z−n) is 2 or greater, each R' may be the same or different.

② At least one compound from among colloidal alumina, colloidal titania, colloidal zirconia, colloidal ceria and colloidal silica.

Further, the production process for the composite particles according to the present invention is characterized by at least one of (1) chemically bonding or chemically bonding and polycondensing the compound of ① and (2) chemically bonding the compound of ② to polymer particles in the presence of the polymer particles, to form at least one of a metal compound section and a silica particle section directly on the polymer particles, without using the coupling compound used for the present invention.

The aqueous dispersion of the present invention contains water and composite particles having polymer particles and at least one of a metal compound portion or section (at least one of a metalloxane bond-containing section and a metal oxide particle section, provided that titanium is not the metal of the metalloxane bond-containing section) and a silica particle portion or section formed directly or indirectly on the polymer particles.

The CMP slurry of the present invention contains water and composite particles having polymer particles and at least one of a silicon compound portion or section and a metal compound portion or section formed directly or indirectly on the polymer particles.

The CMP slurry according to another aspect of the present invention contains water and composite particles obtained by chemically bonding part of a coupling compound to polymer particles and then at least one of (1) chemically bonding or chemically bonding and polycondensing a compound of ① and (2) chemically bonding a compound of ② to another part of the coupling compound, to form at least one of a silicon compound section and a metal compound section indirectly on the polymer particles.

Further, the CMP slurry according to another aspect of the present invention is characterized by containing water and composite particles obtained by at least one of (1) chemically bonding or chemically bonding and polycondensing the compound of ① and (2) chemically bonding the compound of ② in the presence of polymer particles, to form at least one of a silicon compound section and a metal compound section directly on the polymer particles.

The process for manufacture of a semiconductor device according to the present invention is characterized in that a CMP slurry containing water and composite particles having polymer particles and at least one of a silicon compound section and a metal compound section formed directly or indirectly on the polymer particles, is used for manufacture of a semiconductor device.

The process for manufacture of a semiconductor device according to another invention is characterized in that a CMP slurry containing water and composite particles obtained by chemically bonding part of a coupling compound to polymer particles and then at least one of (1) chemically bonding or chemically bonding and polycondensing a compound of ① and (2) chemically bonding a compound of ② to another part of the coupling compound, to form at least one of a silicon compound section and a metal compound section indirectly on the polymer particles, is used for manufacture of a semiconductor device.

Further, the process for manufacture of a semiconductor device according to another invention is characterized in that an aqueous dispersion composition for chemical mechanical polishing containing water and composite particles obtained by at least one of (1) chemically bonding or chemically bonding and polycondensing a compound of ① and (2) chemically bonding a compound of ② to polymer particles in the presence of the polymer particles, to form at least one of a silicon compound section and a metal compound section directly on the polymer particles, is used for manufacture of a semiconductor device.

The composite particles of the present invention have improved strength and hardness and excellent heat resistance, and are useful for various different purposes such as electronic materials, magnetic materials, optical materials, polishing materials and the like. The production process of the present invention can easily produce specific composite particles according to the present invention. In particular, another of the present inventions allows the same specific composite particles to be produced without using a coupling compound. Further, the aqueous dispersion of the present invention is useful for various different purposes including electronic materials, magnetic materials, optical materials and the like. The aqueous dispersion is particularly useful as a polishing material for magnetic disks and wafers.

The CMP slurry of the present invention has improved and, thus, adequate strength and hardness, excellent heat resistance, and provides a sufficiently high polishing rate, while offering excellent polishing performance that produces no scratches on polishing surfaces. The CMP slurry of the present invention is also useful for chemical mechanical polishing in the manufacture of semiconductor devices, and particularly for polishing of wafer surfaces.

The process for manufacture of semiconductor devices according to the present invention also allows easy and convenient manufacture of high-quality semiconductor devices.

The present "polymer particles" are particles composed of a polymer obtained by polymerization of various different monomers. The monomers used may be unsaturated aromatic compounds such as styrene, α-methylstyrene, halogenated styrene and divinylbenzene; unsaturated esters such as vinyl acetate and vinyl propionate; or unsaturated nitriles such as acrylonitrile. There may also be used acrylic acid esters or methacrylic acid esters, such as methyl acrylate, methyl methacrylate, ethyl acrylate, ethyl methacrylate, 2-ethylhexyl acrylate, 2-ethylhexyl methacrylate, lauryl acrylate, lauryl methacrylate, ethyleneglycol diacrylate, ethyleneglycol dimethacrylate, glycidyl acrylate, glycidyl methacrylate, 2-hydroxyethyl acrylate, acryl acrylate and allyl methacrylate.

There may also be used butadiene, isoprene, acrylic acid, methacrylic acid, acrylamide, methacrylamide, N-methylolacrylamide, N-methylolmethacrylamide, and the like. These monomers may be used alone or in combinations of two or more. The monomers may also have functional groups introduced therein, such as hydroxyl groups, epoxy groups, carboxyl groups and the like. When such functional groups are introduced into the polymer particles, it is possible to form a metal compound section or silica particle section directly on the polymer particles without requiring a coupling compound such as a silane coupling agent. However, if the silane coupling agent used has functional groups that can react with the introduced functional groups, bonding between the metal compound section or silica particle section and the polymer particles can be further accelerated, thus yielding composite particles with even better performance.

The polymer particles can be obtained by polymerization of the monomers by any of various processes such as emulsion polymerization, suspension polymerization and dispersion polymerization. These polymerization processes allow appropriate adjustment of the particle size of the polymer particles based on the polymerization conditions. Bulk polymers and the like can be pulverized to obtain polymer particles of a prescribed particle size. When polymer particles with particularly high strength and excellent heat resistance are required, polyfunctional monomers may be used together during production of the polymer particles to introduce a crosslinked structure into the molecule. The crosslinked structure can be introduced by a method such as chemical crosslinking or electron beam crosslinking either during production of the polymer particles, or after production of the polymer particles.

The polymer particles used may be particles composed of various different monomers, such as polyamides, polyesters, polycarbonates and polyolefins, in addition to those mentioned above, and these polymer particles may also have functional groups introduced therein in the same manner as described above, as well as crosslinked structures introduced into the molecules.

The shape of the polymer particles is not particularly restricted, but they are preferably as spherical as possible. The mean particle size as measured with a LASER PARTICLE ANALYZER PAR-III (product of Otsuka Electronics, CO. LTD.) is preferably 0.02–50 $\mu$m, especially 0.05–20 $\mu$m, and more preferably 0.05–1.0 $\mu$m. If the mean particle size is smaller than 0.02 $\mu$m the particles will tend to aggregate, and if it exceeds 50 $\mu$m the dispersion stability will be undesirably impaired when an aqueous dispersion is prepared.

At least part of the "metal compound section" and "silica particle section" of the composite particles of the present invention is chemically or non-chemically bonded to the polymer particles either directly or indirectly, but "chemically bonding" is particularly preferred. This avoids a problem whereby they easily shed from the polymer particles. The chemical bonding may be covalent bonding, ionic bonding or coordination bonding, but covalent bonding is preferred for a stronger bond. As non-chemical bonding there may be mentioned hydrogen bonding, surface charge bonding, interlocking bonding and anchor effect bonding.

Further, the "metal oxide particle portion or section" may consist of an "alumina particle section", "titanic particle section" or "zirconia particle section", or it may be composed of all of these. The alumina particle section, titanic particle section and zirconia particle section, as well as the silica particle section, may be formed in the interior or on the entire surface of the polymer particles, or they may be formed on a part thereof. The "metalloxane bond-containing portion or section" may consist of a single molecule, but is preferably a coupled structure of two or more molecules. In the case of a coupled structure, it may be linear but is more preferably a two-dimensional or three-dimensional structure.

In the CMP slurry of the present invention, at least part of the "silicon compound portion or section" and the "metal compound portion or section" (hereunder referred to collectively as "compound sections") is chemically or non-chemically bonded to the polymer particles either directly or indirectly, but "chemical bonding" is particularly preferred. This avoids a problem whereby they easily shed from the polymer particles during polishing, thus remaining on the polishing surface. The chemical bonding may be ionic bonding or coordination bonding, but covalent bonding is preferred for a stronger bond. As non-chemical bonding there may be mentioned hydrogen bonding, surface charge bonding, interlocking bonding and anchor effect bonding.

Further, the silicon compound section may consist of a "siloxane bond-containing section" or a "silica particle section", or it may be composed of both. The metal compound section may be consist of a "metalloxane bond-containing section", "alumina particle section", "titania particle section" or "zirconia particle section", or it may be composed of two or more of these.

The siloxane bond-containing portion or section and silica particle portion or section, as well as the metalloxane bond-containing section, alumina particle section, titania particle section and zirconia particle section, may be formed in the interior or on the entire surface of the polymer particles, or they may be formed on a part thereof. The siloxane bond-containing section and metalloxane bond-containing section may consist of a single molecule, but is preferably a coupled structure of two or more molecules. In the case of a coupled structure, it may be linear but is more preferably a three-dimensional structure.

According to the present invention, each of the bond-containing sections and particle sections may be formed in the manner described above, or they may have the following structures.

(1) All of the bond-containing sections and particle sections may be directly or indirectly bonded either chemically or non-chemically to the polymer particles, or any one or more thereof may be bonded to the polymer particles.

(2) Another molecule may be bonded at the middle or end portions of the bond-containing sections or particle sections bonded to the polymer particles.

(3) The bond-containing sections or particle sections that are not bonded to the polymer particles and are also not bonded to the bond-containing sections or particle sections bonded to the polymer particles may be sequestered by the bond-containing sections or particle sections chemically or non-chemically bonded to the polymer particles.

The metal compound section or silica particle section may be formed by direct bonding to the polymer particles, or they may be formed by bonding through a coupling compound such as a silane coupling agent. In the latter case, the above-mentioned "coupling compound" is used which lies between the polymer particles and at least one of the compound of ① and compound of ②, and couples the polymer particles with at least one of the compound of ① and compound of ②. As coupling compounds there may be used coupling agents such as silane coupling agents, aluminum-based coupling agents, titanium-based coupling agents and zirconium-based coupling agents, but silane coupling agents are particularly preferred. The following listed as (a), (b) and (c) may be mentioned as silane coupling agents.
(a) vinyltrichlorsilane, vinyltris(β-methoxyethoxy)silane, vinyltriethoxysilane, vinyltrimethoxysilane, γ-methacryloxypropyltrimethoxysilane, γ-mercaptopropyltrimethoxysilane and γ-chloropropyltrimethoxysilane;
(b) γ-glycidoxypropyltrimethoxysilane and γ-glycidoxypropylmethyldiethoxysilane;
(c) N-β(aminoethyl) γ-aminopropyltrimethoxysilane, N-(β (aminoethyl) γ-aminopropylmethyldimethoxysilane and γ-aminopropyltriethoxysilane.

These silane coupling agents preferably have functional groups in the molecules that can easily react with the functional groups such as hydroxyl groups, epoxy groups and carboxyl groups introduced into the polymer particles. For example, for polymer particles having carboxyl groups introduced therein, the silane coupling agents of (b) and (c) above with epoxy groups and amino groups are preferred. Among these, γ-glycidoxypropyltrimethoxysilane and N-(β (aminoethyl) γ-aminopropyltrimethoxysilane are particularly preferred.

As aluminum-based coupling agents there may be mentioned acetoalkoxyaluminum diisopropylate and the like, and as titanium-based coupling agents there may be mentioned isopropyl triisostearoyltitanate, isopropyltridecyl benzenesulfonyltitanate, and the like. These different coupling agents may be used alone or in combinations of two or more. Coupling agents of different types may also be used together.

The amount of coupling agent used between the polymer particles and the compound of ① or the colloidal substance of ② is preferably 0.1–50 moles with respect to one mole of the functional group belonging to or introduced into the polymer particles. The amount is more preferably 0.5–30 moles, and especially 1.0–20 moles. The amount of coupling agent used is less than 0.1 mole because the metal compound sections or particle sections will not bond with sufficient strength to the polymer particles, and will shed more easily from the polymer particles. If the amount used exceeds 50 moles, condensation reaction of the coupling agent molecules will be promoted, forming new polymers in addition to reaction with the molecules composing the polymer particles, and thus inhibiting bonding of the compound sections to the polymer particles. When the coupling agent is chemically bonded to the polymer particles, a catalyst such as an acid or base may be used to accelerate the reaction. The reaction system may also be heated to accelerate the reaction.

In the compound represented by the formula $R_nM(OR')_{z-n}$ above, M is Al, V, Cr, Mn, Fe, Co, Ni, Cu, Zn, Ge, Zr, Nb, Mo, Sn, Sb, Ta, W, Pb or Ce, and z is the valency of M. As the R portion of the general formula there may be mentioned monovalent organic groups including alkyl groups such as methyl, ethyl, n-propyl, iso-propyl, n-butyl, secbutyl, tert-butyl and n-pentyl groups, and phenyl, vinyl and glycidopropyl groups. As the R' portion there may be mentioned alkyl groups such as methyl, ethyl, n-propyl and iso-propyl groups, acyl groups such as acetyl, propionyl, butyryl, valeryl and caproyl groups, and aryl groups such as phenyl and tolyl groups, while n is an integer of 1 to (z–2). In the case of two or more R and R' groups, they may be the same or different.

Particularly preferred as the M portion are Al and Zr, and these elements will be used for M in the following explanation.

As a compound where M is Al there may be mentioned aluminum ethoxide, and as a compound where M is Zr there may be mentioned zirconium tert-butoxide. These compounds induce formation of metalloxane bond-containing sections and alumina particle sections or zirconia particle sections. The compounds may be used alone or in combinations of two or more. Compounds where M is Al or Zr may also be used together. The value of (z–n) is 1 or greater, preferably 2 or greater and more preferably 3 or greater, in which case a more dense metalloxane bond-containing section is formed.

These compounds include not only those represented by the above general formula, but also either hydrolysates or partial condensates of the compounds. The compounds of the above general formula undergo hydrolysis or partial condensation without any special procedures, but if necessary a prescribed proportion thereof may be hydrolyzed or partially condensed beforehand.

These compounds are preferably used in a weight ratio of 0.001–100 with respect to the polymer particles, in terms of $SiO_2$, $Al_2O_3$, $TiO_2$ or $ZrO_2$. The weight ratio is more preferably 0.005–50, and especially 0.01–10. If the weight ratio is under 0.001 the metal compound section will not adequately form in the interior and on the surface of the polymer particles. On the other hand, the weight ratio is above 100 since this will cause the hardness of the polymer particles to be too high.

The "colloidal alumina", "colloidal titania", "colloidal zirconia" and "colloidal silica" consist of fine particles of alumina, titania, zirconia or silica with a mean particle size of 5–500 nm dispersed in a medium such as water. The fine particles may be prepared by particle growth in an aqueous alkali solution, by polycondensation of a metal alkoxide or by a gas phase method, and in practice they are used as colloids dispersed in a medium such as water. Colloidal titania and colloidal silica can be produced from compounds of the general formula $R_nM(OR')_{z-n}$ where M is Ti or Si, similar to colloidal alumina and colloidal zirconia, and a titania particle section and silica particle section can also be formed thereby.

The fine particles can be constructed with an alumina particle section, titania particle section, zirconia particle section or silica particle section without any bonding with the polymer particles. In such cases, however, they must be sequestered with a metalloxane bond-containing section or the like. They may also be bonded with the polymer particles or with the metalloxane bond-containing section by the hydroxyl groups formed in the fine particles, to construct the particle sections. The amount of colloid used is preferably in a weight ratio of 0.001–100 with respect to the polymer particles, in terms of $Al_2O_3$, $TiO_2$, $ZrO_2$ or $SiO_2$. The weight ratio is more preferably 0.01–50, and especially 0.1–10. When the weight ratio is less than 0.001, the particle sections will be insufficiently formed. It is also preferably not over 100 since the hardness of the polymer particles will become too high.

The bonding of each coupling agent to the polymer particles and the reaction of the compound of ① and the colloidal alumina, and the like. of ② with each coupling agent, or their direct reaction with the polymer particles, can be accomplished in dispersion systems where organic solvents such as water or an alcohol are used as the dispersion media. These dispersion media may be of a single type, or they may be a combination of two or more appropriate dispersion media such as water and alcohol. When water is included in the dispersion medium, it is preferred to introduce hydrophilic functional groups such as hydroxyl groups, epoxy groups or carboxylic groups into the polymer particles in order to stabilize the polymer particles in the dispersion system and achieve uniform dispersion. Introduction of these functional groups can also promote easier chemical bonding and/or non-chemical bonding of the coupling agents or the compound of ① and the compound of ② with the polymer particles.

Preferred alcohols for use include lower saturated aliphatic alcohols such as methanol, ethanol, 1-propanol, 2-propanol, 1-butanol, 2-butanol, tert-butanol and the like. These alcohols can be used alone or in combinations of two or more. Other organic solvents besides alcohol, such as methyl ethyl ketone and dimethylformamide may be used, and these organic solvents, water and alcohol may also be used in combination in appropriate weight ratios.

In this reaction, the polymer particle content in the dispersion medium is preferably 0.001–70 wt % (hereunder all "values will mean "wt %"), more preferably 0.01–50%, and especially 0.1–25%. If the content is under 0.001% the composite particle yield will be low, and if it is over 70% the dispersion stability of the polymer particles will be reduced, tending to cause gelling at the compounding stage.

Further, the reaction for formation of the metal compound section or silica particle section can be promoted by heating or using a catalyst. For heating, the reaction system temperature is preferably 40–100° C. As catalysts there may be used acids, bases, aluminum compounds, tin compounds and the like. Acid catalysts and aluminum catalysts provide a particularly notable effect of promoting the reaction. In this production process, the metal compound section is preferably formed first, after which the dispersion is diluted with water or an alkaline aqueous solution, and if necessary the alcohol or other organic solvent is then removed using an evaporator or the like.

The dilution may be carried out using water or an alkaline aqueous solution such as an aqueous solution of ammonia or an aqueous solution of potassium hydroxide. The concentration of the alkaline aqueous solution is preferably 0.001–10%, and especially 0.01–1%. The dilution procedure preferably involves dropwise addition of the dispersion containing the composite particles to the diluting agent using a dispenser, pipette or the like, but the water or alkaline aqueous solution may also be added while stirring the dispersion containing the composite particles.

The shape of the "composite particles" is not particularly restricted but is preferably as spherical as possible. The mean particle size (sphere-equivalent size) is preferably 0.03–100 $\mu$m, more preferably 0.05–20 $\mu$m, and especially 0.05–1.0 $\mu$m. If the mean particle size is less than 0.03 $\mu$m the particles will be too small, failing to give the properties required for such uses as electronic materials, magnetic materials, optical materials, polishing materials, and the like., while if the mean particle size is greater than 100 $\mu$m the shelf-life of aqueous or other dispersions containing the composite particles will be notably shortened. The mean particle size of the composite particles may be measured with the same type of device as for the polymer particles.

The composite particles can be used as a polishing material. The polishing material may contain the composite particles alone, or the polishing material may have an acid, alkali, oxidizing agent and/or surfactant added thereto.

The aqueous dispersion containing the composite particles and water can be applied for a variety of different uses. The aqueous dispersion may also contain other desired components such as acids, oxidizing agents and the like if necessary, and can be used as a polishing material for magnetic disks, and the like. The content of the composite particles in the aqueous dispersion is preferably 0.001–70%. The content is more preferably 0.01–50%, and especially 0.1–20%. If the content of the composite particles is less than 0.001% the performance required for such uses as electronic materials, magnetic materials, optical materials, polishing materials, and the like. will not be obtained, while if it is greater than 70% the shelf-life of the aqueous dispersion containing the composite particles will be notably shortened. The medium of the aqueous dispersion may be water alone, or it may be a mixed medium containing an organic solvent such as an alcohol in combination therewith, so long as the polymer particles do not dissolve.

The composite particles are useful for chemical mechanical polishing, and especially wafer surface polishing, employed in the manufacture of semiconductor device012s or devices, and the composite particles may be combined with water as an aqueous dispersion to be used as a polishing material for manufacture of semiconductor devices (wafers, and the like.). In addition to aqueous dispersions, they may also be in the form of a CMP slurry using an appropriate organic solvent medium that does not dissolve the polymer particles, such as an alcohol dispersion. In the case of a CMP slurry, the composite particle content is preferably 0.001–70%. The composite particle content is more preferably 0.01–50%, and especially 0.1–20%. If the content is less than 0.001%, the required polishing performance cannot be obtained, and if it exceeds 70%, the shelf-life of the CMP slurry containing the composite particles will be notably shortened.

According to the present invention, the aqueous dispersion or CMP slurry may also contain, if necessary, various other additives in addition to the surfactant (for example, oxidizing agents, chelating agents, organic acids, surfactants, pH regulators, and the like.). Such addition can increase the polishing rate, stabilize the oxidizing agent, allow more even dispersion of the polymer particles, and adjust for differences in the polishing rate when polishing films of different hardness, as in cases where two or more working films are polished.

Inclusion of potassium hydroxide or ammonia allows polishing of insulating films, and inclusion of tungsten, aluminum, copper and the like allows polishing of metal films. The composition (particularly a CMP slurry) can also be used in combination with another composition (especially a CMP slurry) in an appropriate weight ratio.

The "oxidizing agent" used is not particularly restricted so long as it is water-soluble, and it is preferably selected as appropriate depending on the electrochemical properties of the metal layer of the working film of the wafer, based on a Pourbaix diagram, for example.

As specific oxidizing agents there may be mentioned organic peroxides such as hydrogen peroxide, peracetic acid, perbenzoic acid, tert-butylhydroperoxide, and the like; permanganate compounds such as potassium permanganate, and the like; bichromate compounds such as potassium bichromate, and the like; halogenate compounds such as potassium iodate, and the like; perhalogenate compounds such as perchloric acid, and the like; transition metal salts such as potassium ferricyanide, and the like; persulfuric compounds such as ammonium persulfate, and the like; polyvalent metal salts such as iron nitrate, cerium ammonium nitrate, and the like; and heteropoly acids such as silicotungstic acid, phosphotungstic acid, silicomolybdic acid, phosphomolybdic acid, and the like. Two or more of these may also be used in combination. By including such oxidizing agents it is possible to vastly increase the polishing rate for polishing of metal layers, and particularly of working films of wafers.

The oxidizing agent content may be 0.1–15 parts, and is particularly preferred to be 0.3–10 parts and especially 0.5–8 parts, with respect to 100 parts of the aqueous dispersion composition. If the content is less than 0.1 part the polishing rate of the aqueous dispersion composition will not be sufficiently increased. On the other hand, a sufficient improvement in the polishing rate can be achieved with a content of 15 parts, so that there is no need to include it at greater than 15 parts.

Examples of the "chelating agent" may be used with no particular restrictions so long as they can form metal chelate compounds, when the wafer working surface film is a metal. When the metal is copper, a compound containing nitrogen is particularly preferred.

As examples there may be mentioned triazole, indole, benzimidazole, benzotriazole, benzoxazole-benzotriazole, quinoline, quinolinic acid, quinoxaline, benzoquinoline, benzoxidine, ammonia, ethylenediamine, triethanolamine, glycine, alanine, leucine, glutamine, glutamic acid, tryptophan, 5-amino-1H-tetrazole, 7-hydroxy-5-methyl-1,3,4-triazaindolazine, benzoguanamine, salicylaldoxime, adenine, guanine, phthalazine, 5-methyl-1H-benzotriazole, 4-amino-1,2,4-triazole, and the like.

By adding appropriate amounts of these chelating agents it is possible to increase the polishing rate for polishing of the metal layers of wafers in particular, and thus improve the planarizing characteristics thereof. These chelating agents can also be used in combinations of two or more. The amount of the chelating agent added may be 0.01–5 parts, preferably 0.02–2 parts and especially 0.04–1 part, with respect to 100 parts of the aqueous dispersion composition.

The "organic acid" can further improve the polishing rate. As organic acids there may be mentioned para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, malefic acid and phthalic acid. Among these, gluconic acid, lactic acid, citric acid, tartaric acid, malic acid, glycolic acid, malonic acid, formic acid, oxalic acid, succinic acid, fumaric acid, malefic acid and phthalic acid are preferred. Among these, tartaric acid, malic acid, succinic acid and phthalic acid are particularly preferred. These organic acids may be used alone or in combinations of two or more. As inorganic acids there may be mentioned nitric acid, hydrochloric acid and sulfuric acid, and these inorganic acids may also be used alone or in combinations of two or more. Combinations of organic acids and inorganic acids may also be used. These acids can be used at 0.1–10 parts by weight and especially 1–8 parts by weight to 100 parts by weight of the aqueous dispersion composition. An acid content in the range of 0.1–10 parts by weight is preferred to give an aqueous dispersion composition with excellent dispersability and sufficient stability, as well as minimal etching and an increased polishing rate.

According to the present invention, a composition containing no surfactant is preferred from the standpoint of polishing performance, but a surfactant may be added for more even dispersion of the particles, particularly the polymer particles, in the aqueous dispersion composition. The surfactant is preferably only present in a small amount from the standpoint of polishing performance. The surfactant content is preferably not greater than 0.15 wt %, more preferably not greater than 0.1 wt %, even more preferably not greater than 0.05 wt %, and especially not greater than 0.01 wt %. The surfactant is used in the procedure for production of the aqueous dispersion containing the polymer particles, and it remains as an impurity in the polymer particles or the water or aqueous medium; however, a lower content thereof will give a polymer particle-containing aqueous dispersion with superior heat resistance, antistatic properties, color fastness, and the like.

The surfactant is preferably contained in the aqueous dispersion or CMP slurry at not greater than 0.05 part by weight and preferably not greater than 0.03 part by weight, with respect to 100 parts by weight of the polymer particles. It is more preferably not greater than 0.01 part by weight, and especially not greater than 0.025 part by weight. Such a composition will exhibit even better heat resistance, antistatic properties, color fastness, and the like.

By thus limiting the surfactant content to a small amount, it is possible to maintain the polishing performance while obtaining particles with excellent dispersability, so that faster polishing can be achieved without creating scratches in the polishing surfaces.

The surfactant used may be a cationic surfactant, anionic surfactant or nonionic surfactant. As cationic surfactants there may be mentioned aliphatic amines, aliphatic ammonium salts and the like. As anionic surfactants there may be mentioned carboxylic acid salts such as fatty acid soaps, alkylether carboxylic acid salts and the like; sulfonic acid salts such as alkylbenzenesulfonic acid salts, alkylnaphthalenesulfonic acid salts, α-olefinsulfonic acid salts and the like; sulfuric acid ester salts such as higher alcohol sulfuric acid ester salts, alkylether sulfuric acid salts, polyoxyethylene alkylphenylethers and the like; phosphoric acid ester salts such as alkylphosphoric acid esters, and the like. As nonionic surfactants there may be mentioned ethers such as polyoxyethylene alkyl ethers; ether esters such as polyoxyethylene ethers of glycerin esters; and esters such as polyethyleneglycol fatty acid esters, glycerin esters, sorbitan esters, and the like.

According to the present invention, addition of an alkali metal hydroxide, ammonia, an inorganic alkali salt, an inorganic acid or an organic acid for adjustment of the pH can improve the dispersability and stability of the aqueous dispersion composition. Ammonia, inorganic alkali salts and inorganic acids are particularly preferred.

As alkali metal hydroxides there may be used sodium hydroxide, potassium hydroxide, rubidium hydroxide, cesium hydroxide and the like. Sodium hydroxide and potassium hydroxide are particularly preferred among these. As inorganic acids there may be used nitric acid, sulfuric acid phosphoric acid or the like, and as organic acids there may be used formic acid, acetic acid, oxalic acid, malonic acid, succinic acid, benzoic acid or the like. Nitric acid and sulfuric acid are commonly used. Adjustment of the pH of the aqueous dispersion composition can improve the dispersability while also increasing the polishing rate, and the pH is preferably determined as appropriate in consideration of the electrochemical properties of the working surface, the dispersability and stability of the polymer particles and the polishing rate.

The working film subjected to chemical mechanical polishing according to the present invention may be a silicon oxide film, amorphous silicon film, polycrystalline silicon film, single-crystal silicon film, silicon nitride film, pure tungsten film, pure aluminum film or pure copper film, or an alloy film of tungsten, aluminum or copper with another metal, formed on a wafer during manufacture of a semiconductor device such as a VLSI or the like. The working film may also be an oxide or nitride film of a metal such as tantalum or titanium.

When the polishing surface of the working film on the wafer is a metal, the polishing rate can be vastly improved by adding an oxidizing agent to the aqueous dispersion composition. The oxidizing agent used may be appropriately selected by a Pourbaix diagram, for example, based on the electrochemical properties of the working surface.

The polymer particles contained in the aqueous dispersion used for chemical mechanical polishing of working films on wafers are preferably selected as appropriate depending on the hardness of the working film. For example, in the case of working films made of aluminum or the like having low hardness, it is preferred to use an aqueous dispersion containing polymer particles with a relatively low hardness. On the other hand, in the case of working films of high hardness such as tungsten, it is necessary to use an aqueous dispersion containing polymer particles of relatively high hardness provided by a high degree of crosslinking.

The chemical mechanical polishing of the working film on the wafer using the aqueous dispersion composition of the present invention can be accomplished with a commercially available chemical mechanical polishing device (such as Model "LGP510" or "LGP552" by Lapmaster SFT Corp.), which has been used in conventional methods employing metal oxide particles as abrasive particles.

After the polishing, it is preferred to remove the residual polymer particles remaining on the polishing surface. The particle removal can be accomplished by a common washing method, and the polishing surface can be heated at high temperature in the presence of oxygen to burn the polymer particles for their removal. As specific methods for burning there maybe mentioned exposure to oxygen plasma, or ashing treatment with plasma whereby oxygen radicals are supplied in a downflow; these allow the residual polymer particles to be easily removed from the polishing surface.

For polishing of a wafer working film that is a metal film in combination with a low-permittivity insulating film, the use of common inorganic particles such as silica or alumina can result in a faster polishing rate on the low-strength, low-permittivity insulating film which is not supposed to be polished, thus creating numerous scratches. In such cases, a process employing an aqueous dispersion composition according to the present invention can, as one of its features, lower the polishing rate and thus prevent scratches.

The manufacturing process of the present invention is a process for manufacture of semiconductor device using the CMP slurry specified above. Here, "semiconductor device" is used in a wide sense to include polished wafers, various devices (including apparatus) provided with or bearing such wafers, plates manufactured from such wafers, and various devices (including apparatus) provided with such plates (i.e., devices on which such plates are mounted).

The present invention will now be explained in further detail by reference to certain examples which are provided solely for purposes of illustration and are not intended to be limitative.

(1) Preparation of aqueous dispersions of polymer particles

Synthesis Example 1

(Preparation of an aqueous dispersion of divinylbenzene polymer particles)

After loading 3353 g of ion-exchange water and 7.4 g of a 15% aqueous solution of an anionic surfactant (trade name "MON-7", product of Sanyo Chemical Industries Co., Ltd.) in a 7-liter volume 4-necked flask, the mixture was stirred for 10 minutes. Addition of 343 g of a 32% aqueous dispersion of a spherical styrene polymer (mean particle size: 0.15 µm) was followed by 5 minutes of stirring while blowing in nitrogen gas. The flask was then immersed in a water bath, and 110 g of a 2% aqueous solution of sodium persulfate was added at the point the temperature reached 80° C.

Next, a pre-mixture of 344 g of ion-exchange water, 147 g of a 15% aqueous solution of MON-7, 35 g of a 25% aqueous solution of a nonionic surfactant (trade name "E920", product of Kao Co., Ltd.) and 1100 g of divinylbenzene in a flask was continuously charged therein over a period of 3 hours. After then reacting the contents of the flask at 80° C. for 2 hours, 55 g of methacrylic acid, 550 g of ion-exchange water and 55 g of a 1% aqueous solution of sodium persulfate were further added, and reaction was conducted for 2 hours while maintaining a temperature of 80° C. After cooling to room temperature, the aggregates were removed with a filter to obtain an aqueous dispersion of divinylbenzene polymer particles. The solid concentration of the aqueous dispersion was 19.8%. The mean particle size of the polymer particles was 0.33 µm.

Synthesis Example 2

(Preparation of another aqueous dispersion of divinylbenzene polymer particles)

An aqueous dispersion of divinylbenzene polymer particles was obtained in the same manner as Synthesis Example 1, except that 55 g of acrylic acid was used instead of the methacrylic acid in Synthesis Example 1. The solid concentration of the dispersion was 19.7%. The mean particle size of the polymer particles was 0.31 µm.

Synthesis Example 3

(Preparation of an aqueous dispersion of styrene-methacrylic acid copolymer particles)

After loading 5078 g of ion-exchange water, 112 g of a 1% aqueous solution of an anionic surfactant (trade name "Emaru AD-25R", product of Kao Co., Ltd.), 119 g of styrene and 21 g of methacrylic acid in a 7-liter volume 4-necked flask, the mixture was stirred for 5 minutes while purging with nitrogen gas. The flask was then immersed in a water bath, and 140 g of a 5% aqueous solution of ammonium persulfate was added at the point the temperature reached 75° C.

After reaction at a temperature of 75° C. for one hour, a mixture of 1232 g of styrene and 28 g of methacrylic acid was continuously charged thereinto over a period of 4 hours and the reaction was continued at 75° C. for 3 hours, after which the reaction mixture was cooled to room temperature to obtain an aqueous dispersion of styrene-methacrylic acid copolymer particles. The solid concentration of the aqueous dispersion was 20%. The mean particle size of the polymer particles was 0.19 µm.

Synthesis Example 4

(Preparation of an aqueous dispersion of polymer particles with amino groups on the particle surfaces)

After loading 1800 g of distilled water, 0.04 g of a cationic emulsifier ("Coatamine 24P", trade name of Kao Co., Ltd.), 40 g of methyl methacrylate and 8 g of an azo-based polymerization initiator ("V50", trade name of Wako Junyaku Co., Ltd.) in a 2 L 4-necked polymerization flask, the mixture was heated to 70° C. while stirring under a nitrogen gas atmosphere, for 2 hours of polymerization. This was followed by continuous addition of 160 g of methyl methacrylate over a period of 3 hours, and continued polymerization at 80° C. for 3 hours. After then cooling to room temperature, the solution was filtered and the aggregates were removed to obtain an aqueous dispersion containing methyl methacrylate polymer particles with amino groups on the particle surfaces. The total solid portion of the aqueous dispersion was 10.2%. The mean particle size of the spherical polymer particles was 0.20 μm.

(2) Production of aqueous dispersions containing composite particles

Example 1A

The aqueous dispersion of divinylbenzene polymer particles obtained in Synthesis Example 1 was heated, condensed and cooled until the solid portion reached 40%, after which 2-propanol was added for dilution to a solid portion of 15%, and the mixture was stirred for 10 minutes to prepare an water/2-propanol mixed dispersion of divinylbenzene polymer particles. After then loading 533 g of this water/2-propanol mixed dispersion into a 2-liter volume 3-necked flask, it was immersed and stirred in a water bath that had been heated to 60° C. The silane coupling agent γ-glycidoxypropyl trimethoxysilane (hereunder abbreviated to "GPTS") was then added at 11 g continuously over a period of 2 hours, and after reaction at 60° C. for 3 hours, the mixture was cooled to room temperature.

A 200 g portion of aluminum ethoxide was then added continuously over a period of 2 hours, and reaction was conducted for 2 hours. Next, ion-exchange water was loaded at 1000 g and stirred for one hour, and then 50 g of a 1% aqueous solution of potassium hydroxide was further added, after which stirring was continued for one hour and the mixture was cooled to room temperature. The 2-propanol was removed to obtain an aqueous dispersion of composite particles with a solid concentration of 12%. The mean particle size of the composite particles was 0.42 μm.

Example 2A

An aqueous dispersion of composite particles with a solid concentration of 11% was obtained in the same manner as Example 1A, except that the aqueous potassium hydroxide solution of Example 1A was replaced with 10% ammonia water. The mean particle size of the composite particles was 0.42 μm.

Example 3A

The aqueous dispersion of divinylbenzene polymer particles obtained in Synthesis Example 1 was heated, condensed and cooled until the solid portion reached 40%, after which 2-propanol was added for dilution to a solid portion of 24%, and the mixture was stirred for 10 minutes to prepare an water/2-propanol mixed dispersion of divinylbenzene polymer particles. After then loading 170 g of this water/2-propanol mixed dispersion into a 300-milliliter volume 3-necked flask, it was immersed and stirred in a water bath that had been heated to 60° C. GPTS was then added at 10 g continuously over a period of 2 hours, and after reaction at 60° C. for 3 hours, the mixture was cooled to room temperature.

Next, 36 g of the water/2-propanol mixed dispersion of GPTS-bonded polymer particles (solid portion: 22%) was loaded into a separate 300-milliliter volume flask, 39 g of 2-propanol was added, and the mixture was immersed and stirred in a water bath that had been heated to 45° C. After then adding 79 g of aluminum ethoxide continuously over a period of 2 hours, reaction was carried out for 2 hours. After completion of the reaction and cooling, 150 g of the reaction solution was added continuously dropwise into 3 liters of a 0.01% aqueous solution of potassium hydroxide, and then the 2-propanol was removed to obtain an aqueous dispersion of composite particles with a solid concentration of 8%. The mean particle size of the composite particles was 0.42 μm.

Example 4A

The aqueous dispersion of divinylbenzene polymer particles obtained in Synthesis Example 2 was heated, condensed and cooled until the solid portion reached 37%, after which 2-propanol was added for dilution to a solid portion of 15%, and the mixture was stirred for 10 minutes to prepare an water/2-propanol mixed dispersion of divinylbenzene polymer particles.

Next, an aqueous dispersion of composite particles with a solid concentration of 12% was then obtained in the same manner as Example 1A, except that the water/2-propanol mixed dispersion of divinylbenzene polymer particles obtained in Synthesis Example 1 used in Example 1A was replaced with the above water/2-propanol mixed dispersion, and the silane coupling agent was changed from GPTS to 9 g of N-(β(aminoethyl) γ-aminopropyltrimethoxysilane. The mean particle size of the composite particles was 0.48 μm.

Example 5A

The aqueous dispersion of styrene-methacrylic acid copolymer particles obtained in Synthesis Example 3 was heated, condensed and cooled until the solid portion reached 36%, after which 2-propanol was added for dilution to a solid portion of 15%, and the mixture was stirred for 10 minutes to prepare an water/2-propanol mixed dispersion of styrene-methacrylic acid copolymer particles.

Next, an aqueous dispersion of composite particles with a solid concentration of 10% was then obtained in the same manner as Example 1A, except that the water/2-propanol mixed dispersion of divinylbenzene polymer particles obtained in Synthesis Example 1 used in Example 1A was replaced with the above water/2-propanol mixed dispersion, the GPTS was used at 10 g, the aluminum ethoxide was used at 100 g and 5 g of 10% ammonia water was used instead of the potassium hydroxide aqueous solution. The mean particle size of the composite particles was 0.25 μm.

Example 6A

The aqueous dispersion of styrene-methacrylic acid copolymer particles obtained in Synthesis Example 3 was heated, condensed and cooled until the solid portion reached 40%, after which 2-propanol was added for dilution to a solid portion of 15%, and the mixture was stirred for 10 minutes to prepare an water/2-propanol mixed dispersion of styrene-methacrylic acid copolymer particles.

Next, 533 g of the water/2-propanol mixed dispersion was loaded into a 2-liter volume 3-necked flask, and the mixture was immersed and stirred in a water bath that had been heated to 60° C. After then adding 11 g of GPTS continuously over a period of 2 hours, reaction was carried out at 60° C. for 3 hours. Next, 100 g of aluminum ethoxide and 120 g of a 30% 2-propanol dispersion containing vapor-phase silica were continuously added to the flask over a period of 2 hours, and reaction was conducted for 2 hours. A 1% aqueous solution of potassium hydroxide was then added at 50 g and stirring was continued for one hour, after which 1000 g of ion-exchange water was loaded in and the mixture was cooled to room temperature. The 2-propanol was then removed to obtain an aqueous dispersion of composite particles with a solid concentration of 9%. The mean particle size of the composite particles was 0.24 µm.

Example 7A

An aqueous dispersion of composite particles with a solid concentration of 10% was then obtained in the same manner as Example 1A, except that the aqueous dispersion of divinylbenzene polymer particles obtained in Synthesis Example 1 used in Example 1A was replaced with the aqueous dispersion of styrene-methacrylic acid copolymer particles of Synthesis Example 3, and the aluminum ethoxide was replaced with aluminum propoxide. The mean particle size of the composite particles was 0.21 µm.

Example 8A

After loading 421 g of the aqueous dispersion of styrene-methacrylic acid copolymer particles obtained in Synthesis Example 3 (solid portion: 20%) into a 2-liter volume 3-necked flask, the mixture was immersed and stirred in a water bath that had been heated to 60° C. After then adding 10 g of GPTS continuously over a period of 2 hours, reaction was carried out at 60° C. for 3 hours. Next, 15 g of zirconium tert-butoxide was continuously added to the flask over a period of 2 hours and stirring was continued for one hour, after which 1000 g of ion-exchange water was loaded in and the mixture was cooled to room temperature. The 2-propanol was then removed to obtain an aqueous dispersion of composite particles with a solid concentration of 10%. The mean particle size of the composite particles was 0.22 µm.

Example 9A

The aqueous dispersion of styrene-methacrylic acid copolymer particles obtained in Synthesis Example 3 was heated, condensed and cooled until the solid portion reached 39%, after which 2-propanol was added for dilution to a solid portion of 15%, and the mixture was stirred for 10 minutes to prepare an water/2-propanol mixed dispersion of styrene-methacrylic acid copolymer particles.

Next, an aqueous dispersion of composite particles with a solid concentration of 9% was then obtained in the same manner as Example 1A, except that the water/2-propanol mixed dispersion of divinylbenzene polymer particles obtained in Synthesis Example 1 used in Example 1A was replaced with the above water/2-propanol mixed dispersion, and no GPTS was added. The mean particle size of the composite particles was 0.23 µm.

Example 10A

An aqueous dispersion of composite particles with a solid concentration of 10% was obtained in the same manner as Example 8A except that no GPTS was added. The mean particle size of the composite particles was 0.21 µm.

(3) Preparation of CMP slurries and polishing of magnetic disk plates

Test Examples 1A–10A. Comparative Test Examples 1A, 2A

Water was used for dilution of the composite particles in the aqueous dispersions obtained in Examples 1A to 10A to 5 wt % concentration, and then aluminum nitrate was added to each dilution as a polishing accelerator to a 5% concentration to obtain CMP slurries (polishing materials).

For comparison, CMP slurries were also prepared with the same composition but containing 5% of colloidal silica (trade name: "Snowtex 20", product of Nissan Chemical Industries Co., Ltd.) or fumed silica (trade name: "Aerosil #90", product of Nihon Aerosil Co., Ltd.).

These CMP slurries were used for polishing of a magnetic disk plate under the following conditions, and the polishing rates and condition of polishing scratches were evaluated.

Polishing conditions

Plate: Ni-P electroless plated 3.5-inch aluminum disk (already subjected to one step of polishing)
Polishing device: Model "LM-15C" by Lapmaster SFT Co., Ltd.
Polishing pad: Trade name: "Polytex DG", by Rodel Corp. (U.S.)
Working load: 70 g/cm$^2$
Plate rotation speed: 50 rpm
Polishing material supply rate: 15 ml/min.
Polishing time: 10 minutes Evaluation method Polishing rate: The polishing rate was determined by the following equation, based on the weight reduction of the disk by polishing.

Polishing rate (nm/min)=$[(W/d)/S] \times 10^7$

W=disk weight reduction per minute due to polishing
d=Ni-P electroless plating density
S=polishing surface area
Polishing scratches: After washing and drying the polished disk, it was placed under a spotlight in a dark room and the presence of scratches was visually observed.

The results of the evaluation are shown in Table 1.

As seen by the results shown in Table 1, when the CMP slurries of Test Examples 1A to 10A were used for polishing of magnetic disks, the polishing rate was high and no polishing scratches were produced. However, when colloidal silica (Comparative Test Example 1A) or fumed silica (Comparative Test Example 2B) was used, the polishing rate was somewhat lower and numerous polishing scratches were observed.

(4) Production of aqueous dispersions containing composite particles

Example 1B

An aqueous dispersion of composite particles (solid concentration: 12%) was obtained in the same manner as Example 1A, except that tetraethyl orthosilicate (hereunder abbreviated to "TEOS") was used instead of the aluminum ethoxide in Example 1A (using the polymer particles obtained in Synthesis Example 1). The mean particle size of the composite particles was 0.43 µm.

TABLE 1

| Test Examples Comp. Test Examples | Polymer Particles | Particle size (µm) | Polishing rate (Å/min) | Condition of polishing scratches |
|---|---|---|---|---|
| Test Ex. 1A | Example 1A | 0.42 | 1850 | no polishing scratches |
| Test Ex. 2A | Example 2A | 0.42 | 1970 | no polishing scratches |
| Test Ex. 3A | Example 3A | 0.42 | 2530 | no polishing scratches |

TABLE 1-continued

| Test Examples Comp. Test Examples | Polymer Particles | Particle size (μm) | Polishing rate (Å/min) | Condition of polishing scratches |
|---|---|---|---|---|
| Test Ex. 4A | Example 4A | 0.48 | 4100 | no polishing scratches |
| Test Ex. 5A | Example 5A | 0.25 | 1920 | no polishing scratches |
| Test Ex. 6A | Example 6A | 0.24 | 2700 | no polishing scratches |
| Test Ex. 7A | Example 7A | 0.21 | 2200 | no polishing scratches |
| Test Ex. 8A | Example 8A | 0.22 | 2400 | slight polishing scratches |
| Test Ex. 9A | Example 9A | 0.23 | 2150 | no polishing scratches |
| Test Ex. 10A | Example 10A | 0.21 | 2510 | no polishing scratches |
| Comparative Test Examples | | | | |
| 1A | colloidal silica | | 1280 | numerous polish. scratch. |
| 2A | fumed silica | | 1450 | numerous polish. scratch. |

Example 2B

An aqueous dispersion of composite particles with a solid concentration of 11% was obtained in the same manner as Example 1B, except that no aqueous solution of potassium hydroxide was added in Example 1B. The mean particle size of the composite particles was 0.45 μm.

Example 3B

An aqueous dispersion of composite particles (solid concentration: 8%) was obtained in the same manner as Example 3A, except that TEOS was used instead of the aluminum ethoxide in Example 3A (using the polymer particles obtained in Synthesis Example 1). The mean particle size of the composite particles was 0.43 μm.

Example 4B

An aqueous dispersion of composite particles (solid concentration: 12%) was obtained in the same manner as Example 4A. The mean particle size of the composite particles was 0.48 μm.

Example 5B

An aqueous dispersion of composite particles (solid concentration: 10%) was obtained in the same manner as Example 5A, except that TEOS was used instead of the aluminum ethoxide in Example 5A (using the polymer particles obtained in Synthesis Example 3). The mean particle size of the composite particles was 0.26 μm.

Example 6B

An aqueous dispersion of composite particles (solid concentration: 9%) was obtained in the same manner as Example 6A, except that TEOS was used instead of the aluminum ethoxide in Example 6A (using the polymer particles obtained in Synthesis Example 3). The mean particle size of the composite particles was 0.24 μm.

Example 7B

An aqueous dispersion of composite particles with a solid concentration of 10% was obtained in the same manner as Example 1B, except that the aqueous dispersion of divinylbenzene polymer particles of Synthesis Example 1 used in Example 1B was replaced with the styrene-methacrylic acid copolymer particles of Synthesis Example 3, and the 200 g of TEOS was replaced with 160 g of methyltrimethoxysilane (hereunder abbreviated to "MTMS"). The mean particle size of the composite particles was 0.22 μm.

Example 8B

An aqueous dispersion of composite particles (solid concentration: 11%) was obtained in the same manner as Example 8A, except that TEOS was used instead of zirconium tert-butoxide in Example 8A (using the polymer particles obtained in Synthesis Example 3). The mean particle size of the composite particles was 0.19 μm.

Example 9B

An aqueous dispersion of composite particles (solid concentration: 9%) was obtained in the same manner as Example 9A (using the polymer particles obtained in Synthesis Example 3). The mean particle size of the composite particles was 0.25 μm.

Example 10B

An aqueous dispersion of composite particles with a solid concentration of 10% was obtained in the same manner as Example 8B except that no GPTS was added. The mean particle size of the composite particles was 0.20 μm.

Example 11B

To a 2 L 4-necked polymerization flask there were added 1000 g of the aqueous dispersion obtained in Synthesis Example 4, 10 g of MTMS, 20 g of TEOS and 500 g of 0.014 μm colloidal silica (Snowtex O, product of Nissan Chemicals Co., Ltd.) diluted to a solid concentration of 10%. After stirring at 40° C. for 2 hours at pH 3 for hydrolysis of the MTMS and TEOS, the pH was increased to 8 and the mixture was stirred at 40° C. for 2 hours for condensation. This produced an aqueous dispersion of composite particles with a solid concentration of 10.1%. The particle size of the composite particles was 0.23 μm.

(5) Preparation of CMP slurries and evaluation of their chemical mechanical polishing performance Test Examples 1B–5B A filter with a pore size of 5 μm was used to remove the aggregates, and the like. from the aqueous dispersions obtained in Examples 1B, 3B, 5B, 6B and 9B, and then ion-exchange water and a 1% aqueous solution of potassium hydroxide were slowly added for adjustment to a solid concentration of 5% and a pH of 10.5, to obtain CMP slurries. These CMP slurries were used for polishing of 8-inch silicon oxide film-coated wafers.

An device with a plate diameter of 500 mm (Model "LM-510") by Lapmaster SFT Corp. was used as the polishing machine, and a pad by Rodel Nitta Corp. (Product No. "IC1000") was mounted on the plate for 3 minutes of polishing. The polishing conditions were a working load of 350 g/cm², a head rotation rate of 50 rpm, a plate rotation rate of 50 rpm and polishing material supply rate of 200 cc/sec. After polishing, the wafer was washed and dried, and the polishing rate and condition of scratches were evaluated.

The polishing rate was determined by the following equation.

Polishing rate (Å/min)=(thickness of silicon oxide film before polishing–thickness of silicon oxide film after polishing)/polishing time The film thicknesses of the silicon oxide films were measured using an interference film thickness probe, model "FTP500-5" by SENTECH Corp.

The condition of scratches was confirmed by observing the polishing surface with a differential interferometer microscope. The results are shown in Table 2.

Test Examples 6B–10B

A filter with a pore size of 5 μm was used to remove the aggregates, and the like. from the aqueous dispersions obtained in Examples 2B, 4B, 7B, 8B and 10B, and then ion-exchange water and an aqueous solution of nitric acid at a concentration of 0.1 mole/liter were slowly added for adjustment to a solid concentration of 6% and a pH of 3.5. Hydrogen peroxide and ion-exchange water were added to each prepared solution further adjusted to a solid concentration of 5% and the hydrogen peroxide concentration of 5% to obtain a CMP slurry.

The CMP slurries were then used for polishing of tungsten.

TABLE 2

| Test Examples Comp. Test Examples | Polymer Particles | Particle size (μm) | Polishing rate (Å/min) | Condition of polishing scratches |
|---|---|---|---|---|
| Test Ex. 1B | Example 1B | 0.43 | 1100(SiO₂) | none |
| Test Ex. 2B | Example 3B | 0.43 | 900(SiO₂) | none |
| Test Ex. 3B | Example 5B | 0.26 | 1000(SiO₂) | none |
| Test Ex. 4B | Example 6B | 0.24 | 1200(SiO₂) | none |
| Test Ex. 5B | Example 9B | 0.25 | 750(SiO₂) | none |
| Test Ex. 6B | Example 2B | 0.45 | 900(W) | none |
| Test Ex. 7B | Example 4B | 0.48 | 900(W) | none |
| Test Ex. 8B | Example 7B | 0.22 | 700(W) | none |
| Test Ex. 9B | Example 8B | 0.19 | 800(W) | none |
| Test. Ex. 10B | Example 10B | 0.20 | 600(W) | none |
| Test Ex. 11B | Example 11B | 0.23 | 5200(Cu) | 900 Å (Dishing) 820 Å (Erosion) |
| Test Ex. 12B | Example 11B | 0.23 | 800(Ta) 980(TaN) | none none |
| Test Ex. 13B | Example 11B | 0.23 | 3800(Al) | none |
| Comparative Test Examples | | | | |
| 1B | Test Ex. 1B (Particles of Synthesis Example 1) | | 100(SiO₂) | none |
| 2B | Test Ex. 2B (Particles of Synthesis Example 3) | | —(SiO₂) | none |
| 3B | Ex. 11B (Particles of Synthesis Example 4) | | 900(Cu) | 1600 Å (Dishing) 1400 Å (Erosion) | film-coated wafers. The polishing time was 5 minutes. The thickness of the tungsten film was determined based on the resistance measured with a resistivity meter by (Model "Σ10") by NPS Corp., and the resistivity (published value). The polishing rate and condition of scratches were evaluated in the same manner as Test Examples 1B–5B. The results are shown in Table 2.

Test Example 11B (Chemical mechanical polishing of copper working film)

The aqueous dispersion obtained in Example 11B was used in a combination for a composite particle concentration of 5%, with hydrogen peroxide added at 0.3%, 7-hydroxy-5-methyl-1,3,4-triazaindolazine added at 0.1% as a planarizing chelating agent, and malonic acid added at 0.4% as an organic acid, and the mixture was adjusted to pH 8.5 with KOH, to obtain a CMP slurry.

When a patterned copper film wafer SKW6-2 (product of SKW Corp.) was polished under conditions with an IC1000/SUBA400 (product of Rodel-Nitta Corp.) as the polishing pad and using an EPO-113 chemical mechanical polishing device (product of Ebara Corp.) while supplying the aforementioned aqueous dispersion for chemical mechanical polishing at 200 ml/min and with a pressure of 300 g/cm², the polishing rate was 5200 angstroms/min. The dishing with a 100 micron wiring width at the exact point was 710 angstroms, and the 90% density erosion at a 5 micron pitch was also satisfactory at 640 angstroms.

Upon polishing under conditions of 50% overpolishing, the dishing with a 100 micron wiring width was 900 angstroms and the 90% density erosion at a 6 micron pitch was 820 angstroms, and therefore the overpolishing margin was also satisfactory. The results are shown in Table 2.

Test Example 12B (Chemical mechanical polishing of Ta and TaN working films)

An aqueous dispersion containing the composite particles obtained in Example 11B was used in a combination for a composite particle concentration of 3%, with 7-hydroxy-5-methyl-1,3,4-triazaindazoline added at 0.1% as an additive, and the mixture was adjusted to pH 3.0 with nitric acid, to obtain a CMP slurry.

When this was used for polishing of two different test wafers, with 1000 angstrom films of Ta or TaN, the polishing rates were 800 and 980 angstrom/min, respectively. The polishing rates of the Cu and TEOS films were satisfactory at 400 and 20 angstroms/min, respectively. Because the CMP slurries had excellent selectivity, they were demonstrated to be suitable for use in the second stage of a copper damascene process. The results are shown in Table 2.

Test Example 13B (Chemical mechanical polishing of aluminum working film)

The aqueous dispersion obtained in Example 11B was used in a combination for a composite particle concentration of 3%, with potassium persulfate added at 1% as an additive, and the mixture was adjusted to pH 8.0 with nitric acid, to obtain a CMP slurry for aluminum film polishing.

When this slurry was used for polishing of a test wafer with a 5000 Å aluminum film, the polishing rate was 3800 Å/min. It was thus demonstrated that the CMP slurry is suitable for aluminum films as well. The results are shown in Table 2.

Comparative Test Example 1B

The dispersion obtained in Synthesis Example 1 was adjusted to a solid concentration of 5% and a pH of 10.5 with ion-exchange water and a 1% aqueous solution of potassium hydroxide, and this was used for polishing of a silicon oxide film-coated wafer in the same manner as Test Example 1. The polymer particles used in this example were not composite particles. The results are shown in Table 2.

Comparative Test Example 2B

The dispersion obtained in Synthesis Example 3 was adjusted to a solid concentration of 6% and a pH of 3.5 with ion-exchange water and nitric acid with a 0.1 mole/liter concentration. Hydrogen peroxide and ion-exchange water were added to the adjusted solution, for further adjustment to a solid concentration of 5% and a hydrogen peroxide concentration of 5%. A tungsten film-coated wafer was then polished in the same manner as Test Example 2. The polymer particles used in this example were not composite particles. The results are shown in Table 2.

Comparative Test Example 3B

The CMP slurry used in Test Example 11B was used for polishing in the same manner as Test Example 11B, except that the polymer particles prepared in Synthesis Example 4 were added at 5% instead of the composite particles synthesized in Example 11B.

As a result, the polishing rate was very low at 900 Å/min, the dishing with a 100 micron wiring width at the exact point was 1600 angstroms, and the 90% density erosion at a 5 micron pitch was also a poor level of 1400 Å. The results are shown in Table 2.

Results of Test Examples 1B–10B

The results in Table 2 show that the polishing rate was sufficiently high at 750 Å/min in Test Examples 1B–5B where the polished materials were silicon oxide films, and even in Test Example 5B where the aqueous dispersion of Example 9B was used which had TEOS directly bonded on the surface of the polymer particles without GPTS. In Test Examples 6B–10B where the polished materials were tungsten films, the polishing rate was sufficiently high at 600 Å/min, even in Test Example 10B where the aqueous dispersion of Example 10B was used which had TEOS directly bonded to the surface of the polymer particles, without GPTS. In all of the Test Examples 1B–10B there were absolutely no scratches, indicating that the CMP slurries exhibit excellent polishing performance.

On the other hand, while no scratches were found in the Comparative Test Example 1B, the polishing rate was low at 100 Å/min, and polishing was completely impossible in Comparative Test Example 2B. In Comparative Test Example 3B, the dishing and erosion were unsatisfactory.

As shown by Test Examples 11B–13B, excellent polishing rates were achieved in polishing of a W layer, Ta layer, TaN layer and Al layer. Test Example 11B exhibited excellent results, including a higher polishing rate than Comparative Test Examples 3B, and also better dishing and erosion.
(6) CMP tests on low permittivity insulating films Test Example 1C ① Synthesis of low permittivity insulating material In a separable flask there were charged 170.7 g of methyltrimethoxysilane, 42.7 g of tetramethoxysilane, 1.0 g of diisopropoxytitanium bisethylacetylacetate and 417 g of propyleneglycol monopropylether, and after stirring the mixture it was heated to 60° C. A mixed solution of 176 g of ion-exchange water and 206 g of propyleneglycol monopropylether was then added thereto over a period of 2 hours while maintaining a temperature of 60° C., and reaction was conducted for 8 hours at 60° C. Acetylacetone was added at 51 g, and 500 g of the solvent containing methanol was removed at 40° C. under reduced pressure to obtain an aqueous solution containing a low permittivity insulating material.

② Fabrication of coating containing low permittivity insulating material and film comprising low permittivity insulating material The aqueous solution obtained in ① above was applied onto an 8-inch silicon wafer surface with a spin coater. The coating was carried out for 31 seconds with a rotation rate of 2500 rpm. The aqueous solution-coated wafer was then heated for 5 minutes on a hot plate heated to 80° C. to remove the organic solvent. The wafer was then further heated for 5 minutes on a hot plate heated to 200° C., after which it was further heated for 60 minutes in an oven with a nitrogen atmosphere that had been heated to 450° C., to harden the coating on the wafer surface to form a film.

③ Evaluation of film permittivity

Aluminum was vapor-deposited onto the film obtained in above, and measurement of the permittivity at a frequency of 1 MHZ gave a low value of 2.65. The permittivity was measured using an HP 16451B electrode and HP4284A Precision LCR meter by Yokokawa-Hewlett Packard Co.

④ CMP test

The CMP slurry obtained in Test Example 11B was used for polishing in the same manner as Test Example 1B on a low permittivity material film formed in the same manner as ② above. The polishing rate was calculated according to Test Example 1, and the condition of scratches was evaluated. As a result, the polishing rate was low at 50 Å/min, which was sufficient for the requirement, and the number of scratches on the polished surface was a satisfactorily low level of no more than 30.

Test Example 2C

A test was carried out in the same manner as Test Example 1C, except that the product "FLARE" (permittivity: approximately 2.7) by Allied Signal Corp. was used instead of the low permittivity insulating material used in Test Example 1C. As a result, the polishing rate was 55 Å/min, and the number of scratches on the polished surface was no more than 30.

Test Example 3C

A test was carried out in the same manner as Test Example 2C, except that the product "BCB"(permittivity: approximately 2.7) by Dow Chemical Corp. was used instead of the product "FLARE" by Allied Signal Corp.. As a result, the polishing rate was 65 Å/min, and the number of scratches on the polished surface was not more than 30.

Comparative Test Example 1C

For comparison, an evaluation was carried out in the same manner as Test Example 1C, except that silica prepared by the fumed method was used instead of composite particles. As a result, the polishing rate was higher at 1200 Å/min, and over 100 scratches were produced over the entire wafer surface.

Effect of Test Examples 1C–3C

When metal films combined with low permittivity insulating films were used as the wafer working films for polishing with silica (Comparative Test Example 1C), the polishing rate was high on the low strength, low permittivity insulating film that was not desirable to be polished, and numerous scratches were produced. On the other hand, when the CMP slurries of the present invention were used (Test Examples 1C–3C), the polishing rates were sufficiently low as required, and the numbers of scratches on the polished surfaces were also at a satisfactory level of not more than 30.

What is claimed is:

1. A process for chemical mechanical polishing of a working film on a wafer, which comprises effecting said chemical mechanical polishing with an aqueous dispersion composition comprising water and composite particles, said composite particles comprising polymer particles having at least one of a siloxane bond-containing section and a metal compound section directly or indirectly on said polymer particles;

said metal compound section being selected from the group consisting of a metalloxane bond-containing section, an alumina particle section, ceria particle section, and a zirconia particle section.

2. The process of claim 1, wherein said working film comprises a film of silicon oxide, amorphous silicon, polycrystalline silicon, single-crystal silicon, silicon nitride, pure tungsten, pure aluminum, pure copper, alloy of tungsten, aluminum or copper with another metal, an oxide or nitride film of tantalum or titanium, or a low-permissivity insulating film.

3. The process of claim 1, wherein at least part of said at least one of a siloxane bond-containing section and said metal compound section is chemically bonded to another part of a coupling compound of which part is chemically bonded to said polymer particles of said composite particles.

4. The process of claim 1, wherein at least part of said at least one of a siloxane bond-containing section and said at least one metal compound section is chemically bonded directly to said polymer particles of said composite particles.

5. The process of claim 3, wherein said coupling compound is a silane coupling compound.

6. The process of claim 1, wherein the composition further contains an oxidizing agent or a chelating agent or both.

7. The process of claim 6, wherein said oxidizing agent is a persulfate or hydrogen peroxide, and said chelating agent is a nitrogen-containing compound.

8. The process of claim 7, wherein the composition further contains an organic acid.

9. The process of claim 8, wherein said organic acid is at least one selected from the group consisting of gluconic acid, lactic acid, citric acid, tartaric acid, malic acid, glycolic acid, malonic acid, formic acid, oxalic acid, succinic acid, fumaric acid, maleic acid and phthalic acid.

10. The process of claim 1, wherein said composite particles have a mean particle size of 0.03–100 μm.

11. The process of claim 10, wherein said composite particles have a mean particle size of 0.05–20 μm.

12. The process of claim 11, wherein said composite particles have a mean particle size of 0.05–1 μm.

13. An aqueous chemical mechanical polishing dispersion composition which comprises water and composite particles comprising polymer particles having at least one of a siloxane bond-containing section and a metal compound section directly or indirectly on said polymer particles;

said metal compound section being selected from the group consisting of a metalloxane bond-containing section, an alumina particle section, ceria particle section, and a zirconia particle section.

14. The aqueous dispersion composition of claim 13, wherein said at least one siloxane bond-containing section and metal compound section is chemically bonded to another part of a coupling compound of which part is chemically bonded to said polymer particles of said composite particles.

15. The aqueous dispersion composition of claim 13, wherein said at least one siloxane bond-containing section and metal compound section is chemically bonded directly to said polymer particles of said composite particles.

16. The aqueous dispersion composition of claim 14, wherein said coupling compound is a silane coupling compound.

17. The aqueous dispersion composition of claim 13, wherein said composite particles comprise a metal compound section which is an alumina section.

18. The aqueous dispersion composition of claim 16, further comprises an oxidizing agent or chelating agent or both.

19. The aqueous dispersion composition of claim 18, wherein said oxidizing agent is a persulfate or hydrogen peroxide.

20. The aqueous dispersion composition of claim 18, wherein said chelating agent is a nitrogen-containing compound.

21. The aqueous dispersion composition of claim 13, wherein said polymer particles are made of polymers of at least one monomer selected from the group consisting of unsaturated aromatic compounds, unsaturated esters, unsaturated nitriles, acrylic acid esters, methacrylic acid esters, butadiene, isoprene, acrylic acid, methacrylic acid, acrylamide, methacrylamide, N-methylolacrylamide and N-methylolmethacrylamide.

22. The aqueous dispersion composition of claim 21, wherein said polymer particles are made of polymers of monomers comprising styrene, α-methylstyrene, halogenated styrene, divinylbenzene, vinyl acetate, vinyl propionate, acrylonitrile, acrylic acid esters, or methacrylic acid esters.

23. The aqueous dispersion composition of claim 21, wherein said polymer particles are further made of polymers of monomers comprising butadiene, isoprene, acrylic acid, methacrylic acid, acylamide, methacrylamide, N-methylolacrylamide or N-methylolmethacrylamide.

24. The aqueous dispersion composition of claim 16, wherein said silane coupling compound is γ-glycidoxypropyl trimethoxysilane or N-β(aminoethyl) γ-aminopropyltrimethoxysilane.

25. The aqueous dispersion composition of claim 14, wherein said chemical bonding is covalent bonding.

26. The aqueous dispersion composition of claim 15, wherein said chemical bonding is covalent bonding.

27. The aqueous dispersion composition of claim 21, wherein said polymers further comprise functional groups comprising hydroxyl, epoxy, or carboxyl groups.

28. The aqueous dispersion composition of claim 13, wherein said polymer particles have a mean particle size of from 0.05–20 μm.

29. The aqueous dispersion composition of claim 28, wherein said polymer particles have a mean particle size of from 0.05–1 μm.

30. The aqueous dispersion of claim 13, wherein said composite particles are spherical.

31. The aqueous dispersion of claim 13, wherein said composite particles are present in a solids content of from 0.001–70%.

32. The aqueous dispersion of claim 28, wherein said composite particles are present in a solids content of from 0.1–20%.

33. The aqueous dispersion of claim 13, wherein said metal compound section is present and comprises a metalloxane bond-containing section.

34. The aqueous dispersion of claim 13, wherein said metal compound section is present and comprises an alumina particle section.

35. The aqueous dispersion of claim 13, wherein said metal compound section is present and comprises a ceria particle section.

36. The aqueous dispersion of claim 13, wherein said metal compound section is present and comprises a zirconia particle section.

37. The aqueous dispersion of claim 13, wherein said siloxane bond-containing section is present.

* * * * *